United States Patent [19]

Petermann et al.

[11] Patent Number: 4,647,523
[45] Date of Patent: Mar. 3, 1987

[54] PRODUCTION OF A RESIST IMAGE

[75] Inventors: Juergen Petermann, Buxtehude, Fed. Rep. of Germany; Harald Fuchs, Thalwil, Switzerland

[73] Assignee: BASF Aktiengesellschaft, Fed. Rep. of Germany

[21] Appl. No.: 749,725

[22] Filed: Jun. 28, 1985

[30] Foreign Application Priority Data

Jun. 30, 1984 [DE] Fed. Rep. of Germany ....... 3424187

[51] Int. Cl.$^4$ ................................................ G03C 5/00
[52] U.S. Cl. .................................... 430/296; 430/325; 430/330; 430/942
[58] Field of Search ................ 430/325, 296, 330, 942

[56] References Cited

U.S. PATENT DOCUMENTS 3,594,170 7/1971 Broyde .................................... 96/36

OTHER PUBLICATIONS

High Resolution Electron Microscopy, Giorgio et al, Journal of Polymer Science: Polymer Physics ed., vol. 22, 1931–1951 (1984).
Radiation Induced Phase Transition of Paraffins, Kawagushi et al, Inst. for Chem. Rev., Kyoto Univ., Kyoto Japan, vol. 59, No. 4, 284–92, Jul. 82.

*Primary Examiner*—John E. Kittle
*Assistant Examiner*—Patrick J. Ryan
*Attorney, Agent, or Firm*—Keil & Weinkauf

[57] ABSTRACT

A resist image is produced from a high-resolution, radiation-sensitive resist material by a process in which paraffin is applied as a resist material in a thin layer onto a substrate and irradiated in a predetermined pattern, for example by means of an electron beam, with crosslinking, and the non-irradiated, non-crosslinked parts of the resist layer are then removed. Particularly advantageously, the resist layer consisting of the paraffin is applied onto the substrate by vapor deposition and, after imagewise irradiation, the non-irradiated parts of the resist layer are removed by evaporation in order to develop the resist image.

7 Claims, No Drawings

PRODUCTION OF A RESIST IMAGE

The present invention relates to a process for the production of a resist image from a high-resolution, radiation-sensitive resist material, in which the latter is applied in a thin layer onto a substrate and exposed to high-energy radiation, in particular electron beams, in a predetermined pattern, and the unexposed parts of the resist layer are then removed.

Electron beam resists are known. They are positive-working or negative-working, depending on the resist material used, and can be employed, in particular, for the production of semiconductor arrangements, integrated circuits, microcircuits, electronic components and the like. Compared with the conventional photoresists, the electron beam resists have the advantage that they give substantially better resolution. While positive resists are generally preferred for high resolution, negative resists are usually somewhat more sensitive.

A large number of different polymers, eg. polymethyl methacrylate, polyisobutylene, polymethyl isopropenyl ketone, epoxidized polybutadiene, polydiallyl orthophthalate, polysilicones, polycarbonates and halogenated polyethylenes, have been suggested as resist materials for electron beam resists. Regarding the prior art, reference may be made to, for example, Polymer Eng. and Sci., 14, No. 7 (1974), 516–517; Org. Coatings and Applied Polymer Sci. Proc., 48, (1983), 150–155; J. Appl. Polym. Sci. 25, (1980), 1131–1136 and Amer. Chem. Soc., Div. Org. Coatings Plast. Chem., 35, No. 1 (1975), 108–117. The suitability of the stated resist materials varies from one application to another. The resist materials are applied from solution onto the substrate to be further processed. Development of the resist image after imagewise exposure of the resist material is likewise generally carried out using a developer. The use of solvents and the procedures for recovering them entail considerable expense.

It has also been proposed to replace the wet development procedure for the resist layers with a dry development procedure, by etching the imagewise exposed resist layer with plasma gas (cf. DE-C-27 26 813 and EP-A-17032). The resist materials used in this context are photoresists which contain not only a polymeric binder but also polymerizable monomers. Monomer-containing resist layers have to be handled very carefully, and special safety regulations have to be observed in some cases. Furthermore, the dry development of resist layers by means of plasma etching requires technically complicated and expensive apparatuses.

It is an object of the present invention to provide a process for the production of a resist image which can be carried out in a simple manner and also permits high resolution to be achieved. A further object of the invention is to provide another, advantageous resist material for electron beam resists.

We have found that this object is achieved by the use of paraffins as resist material for beam resists.

The present invention accordingly relates to a process for the production of a resist image from a high-resolution, radiation-sensitive resist material, in which the latter is applied as a layer onto a substrate and is irradiated in a predetermined pattern with crosslinking of the resist material, and the non-irradiated parts of the resist layer are then removed, wherein the resist material applied is a paraffin.

The present invention furthermore relates to special embodiments of this process, in accordance with the detailed description of the invention below.

The paraffins employed according to the invention as resist materials are straight-chain or branched, saturated, aliphatic hydrocarbons which are unsubstituted or substituted, for example by carboxyl, ester groups, hydroxyl or the like. However, unsubstituted paraffin hydrocarbons are preferably used. The paraffins employed according to the invention are generally solid at room temperature and preferably have a melting point of from 30° to 150° C., in particular about 40°–120° C. Paraffins which have a lower melting point and are usually liquid at room temperature, for example those having a yield point as low as about −30° C., may also be employed, particularly if the procedure is carried out with the substrate being cooled at below the yield point of the paraffins. Preferably used paraffins can be vaporized at elevated temperatures, if necessary under reduced pressure, without significant decomposition and in particular without leaving a residue. Particularly advantageous paraffins are those of not less than 10 carbon atoms, in particular those of about 20 to 70 carbon atoms. The molecular weight of these paraffins is from 130 to 1,000. According to the invention, wax-like paraffins are preferably used as resist materials. The paraffins can be employed individually or as a mixture with one another. Paraffins containing a fairly large number of carbon atoms generally consist of a mixture of paraffins of about the same chain length and the same molecular weight. However, mixtures of paraffins of different chain lengths and different molecular weights may also be employed in the process according to the invention.

Substrates onto which the resist material can be applied, and on which the resist image can then be produced, are the substrates conventionally used for electron beam resists. These include, for example, ceramic, metallic or metal oxide bases or substrates, or substrates laminated with metallic or metal oxide layers. Particular example of substrates are semiconductor elements and the conventional wafers. The latter are in general silicon, GaAs or InSb disks which may be provided with an oxide layer or general insulating layer on the surface.

The paraffins can be applied as a resist material in a thin layer onto the substrate by conventional coating techniques, for example by coating from solution and evaporating the solvent, hot-melt coating, or laminating a preproduced paraffin layer with the substrate. A very advantageous and simple method of applying the paraffin onto the substrate is by vapor deposition, in particular under reduced pressure.

The thickness of the paraffin layer applied as a resist material on the substrate depends on the intended use of the resist image and can vary within wide limits, for example from 0.01 to 10 μm. The resist layer is preferably about 0.01–2 μm thick, and very advantageous results are obtained in particular in the range from 0.05 to 1 μm.

The resist layer applied on the substrate and consisting of the paraffin is exposed to electromagnetic radiation capable of crosslinking the paraffin in the exposed areas. High-energy beams, eg. electron beams, gamma radiation or the like, are particularly useful for this purpose. For example, the novel process can be carried out using electron beams which have an acceleration voltage of about 10–40 KeV or of 100–300 KeV or higher.

Where electron beams are used, the acceleration voltage is, in particular, about 10–1,000 KeV. The radiation dose is usually from $10^{-5}$ to $10^{-1}$, preferably from $10^{-4}$ to $10^{-2}$, C/cm². Examples of suitable radiation sources for gamma radiation are $^{60}$Co sources. The resist material applied on the substrate is exposed imagewise to the radiation in a conventional manner, ie. in a predetermined pattern corresponding to the desired resist image. The duration of irradiation depends on, inter alia, the thickness of the resist layer and the type of radiation used, and is in general from a few seconds to a few minutes. When electron beams are used, the greater the acceleration voltage, in general the longer is the irradiation time. Typical irradiation times for the novel process are, for example, from 0.1 to 10, preferably from 0.5 to 2, minutes.

Exposure to radiation results in crosslinking of the paraffin in the exposed areas. To develop the resist image, the non-irradiated, non-crosslinked parts of the paraffin resist layer are then removed. Development of the resist image can be carried out by a conventional wet or dry development procedure, ie. by treating the imagewise exposed resist layer with a suitable solvent or by plasma etching by means of a plasma gas. A particular advantage of the novel process is that the development of the resist image after imagewise exposure of the resist layer can be effected in a simple manner by evaporating the non-irradiated parts of the paraffin layer. The paraffin is evaporated, for example, under reduced pressure and at elevated temperatures, for example at about 50°–200° C., depending on the size of the applied vacuum, the type of paraffin and the intended development time.

The novel process gives resist images which constitute an exact and crisp copy of the original, have very well formed edge structures and possess high resolution. Thus, the novel process can be used to produce images having, for example, line thicknesses and spacings smaller than the thickness of the resist layer. For example, with a 0.1 μm thick resist film, line spacings of 0.04 μm could be reproduced exactly without difficulty. Depending on the focussing of the beam, the thickness of the paraffin resist layer, etc., the resolving power can be as high as about 2 nm. The novel process has the further advantage that it can be carried out in a very simple manner compared with the conventional processes, since the paraffin can be applied as a resist material onto the substrate by vapor deposition and, after imagewise irradiation, the non-crosslinked paraffin can be evaporated again. This makes it possible, for example, for application of the resist material onto the substrate, exposure of the resist layer to electron beams and evaporation of the non-irradiated, non-crosslinked parts of the paraffin resist layer with development of the resist image to be carried out in direct succession in an apparatus comprising a simple reduced-pressure chamber. The use of solvents for applying or developing the resist layer is thus avoided.

After the non-irradiated parts of the resist layer have been removed, with development of the resist image, the bared parts of the substrate can be permanently modified in a conventional manner, in particular by etching or doping, or even by deposition of metal. The resist images produced by the novel process can, like the conventional electron beam resists, be employed for the production of circuit boards, printed circuits, thin film circuits or microcircuits, integrated circuits, semiconductor arrangements, electronic components and the like. The high resolution achievable permits even very fine image elements to be reproduced faithfully to the original. The resist images produced according to the invention possess good stability during further processing. After the substrate has been permanently modified, the resist layers can be removed from the substrate by a conventional technique.

The Example which follows illustrates the invention.

EXAMPLE

A paraffin containing about 44 carbon atoms and having a melting point of from 69° to 73° C. was applied, by vapor deposition, onto a carbon substrate under reduced pressure (about $10^{-6}$ mmHg) at 170° C. The distance between the vapor source and the substrate was 20 cm, and the time for vapor deposition was about 30 sec. During this procedure, a paraffin film about 0.3 μm thick was produced on the substrate. This paraffin film was then exposed to an electron beam, in a predetermined half-tone pattern, in a type JEM 200 CX scanning transmission electron microscope from JEQL. The acceleration voltage was 200 KeV, electron-optical magnification was 20,000 times, and the beam current at the anode was measured as 170 uA. The resist layer was exposed through the half-tone screen in 5 scan passes, the total irradiation time being 60 sec. The irradiated resist was then heated at 120° C. for 30 minutes under reduced pressure ($10^{-6}$ mmHg). During this procedure, the paraffin which had not been crosslinked by the electron beam evaporated. The resulting resist image was faithful to the original and had crisp contours and steep sidewalls. The resolution was 0.002 μm.

We claim:

1. A process for the production of a resist image from a high-resolution, radiation-sensitive paraffin resist material, in which the resist material is applied to a substrate by vapor deposition as a thin layer and is irradiated in a predetermined pattern with crosslinking of the paraffin resist material, and the non-irradiated parts of the resist layer are then removed by evaporating the non-crosslinked paraffin.

2. The process of claim 1, wherein the resist material applied is a paraffin having a melting point of from about −30° to 150° C.

3. The process of claim 1, wherein the resist material applied is a paraffin which possesses about 10 to 70 carbon atoms.

4. The process of claim 1, wherein the resist material applied is a wax-like paraffin.

5. The process of claim 1, wherein the resist material applied is a mixture of different paraffins.

6. The process of claim 1, wherein the resist layer is irradiated in a predetermined pattern by means of an electron beam.

7. The process of claim 6, wherein, for irradiation of the resist material, an electron beam having an acceleration voltage of from 10 to 1,000 KeV and a charge density of from $10^{-5}$ to $10^{-1}$ C/cm² is used.

* * * * *